United States Patent [19]
Marcus

[11] Patent Number: 5,310,511
[45] Date of Patent: May 10, 1994

[54] METHOD AND APPARATUS FOR POLING A PLANAR POLARIZABLE BODY

[75] Inventor: Michael A. Marcus, Honeoye Falls, N.Y.

[73] Assignee: Eastman Kodak Company, Rochester, N.Y.

[21] Appl. No.: 857,049

[22] Filed: Mar. 24, 1992

[51] Int. Cl.$^5$ .............................. B29C 71/04
[52] U.S. Cl. ...................... 264/22; 264/24; 310/357; 425/174.8 E
[58] Field of Search ............ 264/22, 24, 27; 425/174.8 E, 174.8 R, 174.6; 310/357

[56] References Cited

U.S. PATENT DOCUMENTS

| | | | |
|---|---|---|---|
| Re. 23,813 | 4/1954 | Adler | 179/100.41 |
| 940,429 | 11/1909 | Chapman | 361/260 |
| 2,540,194 | 2/1951 | Ellett | 171/327 |
| 2,540,412 | 2/1951 | Adler | 171/327 |
| 3,175,107 | 3/1965 | Brussaard et al. | 310/359 |
| 3,470,417 | 9/1969 | Gibbons | 317/4 |
| 3,945,099 | 3/1976 | Kansy | 29/25.35 |
| 4,109,359 | 8/1978 | Cross et al. | 29/25.35 |
| 4,112,299 | 9/1978 | Davis | 250/326 |
| 4,308,223 | 12/1981 | Stern | 264/22 |
| 4,308,370 | 12/1981 | Fukada et al. | 264/22 |
| 4,345,359 | 8/1982 | Micheron | 310/357 |
| 4,356,424 | 10/1982 | Marcus | 310/357 |
| 4,375,718 | 3/1983 | Wadsworth et al. | 264/22 |
| 4,410,823 | 10/1983 | Miller et al. | 310/313 |
| 4,456,365 | 6/1984 | Yuasa | 355/3 |
| 4,491,761 | 1/1985 | Grudkowski et al. | 310/359 |
| 4,500,377 | 2/1985 | Broussoux et al. | 264/22 |
| 4,512,941 | 4/1985 | Seggern et al. | 264/24 |
| 4,517,143 | 5/1985 | Kisler | 264/22 |
| 4,518,889 | 5/1985 | 'T Hoen | 310/357 |
| 4,714,848 | 12/1987 | Chen | 310/359 |

FOREIGN PATENT DOCUMENTS

| | | | |
|---|---|---|---|
| 0237709 | 9/1987 | European Pat. Off. | 264/22 |
| 61-285710 | 12/1986 | Japan | 264/22 |

*Primary Examiner*—Jeffery Thurlow

[57] ABSTRACT

A planar polarizable body is poled by placement between removable patterned plates which have conjugate patterns of open apertures and subjecting the open apertures to an electric field of the same polarity on opposite sides of the body, the field being of sufficient magnitude to induce polarization of the body material in opposite directions through the thickness dimension of the body with regions of alternate polarity at different lateral locations across the surface of the body in a desired pattern.

4 Claims, 2 Drawing Sheets

METHOD AND APPARATUS FOR POLING A PLANAR POLARIZABLE BODY

FIELD OF INVENTION

The present invention relates in general to poling a planar body of polarizable material and, more particularly, to poling such material through the thickness dimension of the body simultaneously in opposite directions in adjacent areas of the body.

BACKGROUND

Polarization of planar bodies, in particular bodies comprised of piezoelectric and pyroelectric materials, collectively referred to as a ferroelectric material or body, is useful for producing sensors capable of detecting applied forces or differentials in temperature. Techniques for producing polarization patterns in such bodies are well known.

It is known that when a piezoelectric material is stressed or strained, it develops a charge on the surface of the material. When electrodes are placed on opposing surfaces of the piezoelectric material, the induced charge will be distributed over the area of the electrodes, and a voltage potential difference will be induced across the opposing electroded surfaces of the material. The magnitude of the induced voltage across the electroded surface will be proportional to the induced stress across the film's thickness. This signal will slowly decay with time as the stress distribution across the film's thickness comes to equilibrium.

Similarly, it is known that when a pyroelectric material is heated it develops a charge on the surfaces of the material. When electrodes are placed on opposing surfaces of the material, the induced charge will be distributed over the area of the electrodes and a voltage potential difference will be induced across the opposing electroded surfaces of the pyroelectric material. The magnitude of the induced voltage across the electrode surface will be proportional to the change in temperature of the film structure. This signal will slowly decay with time as the temperature across the film's thickness comes to equilibrium.

In order to utilize the piezoelectric or pyroelectric properties of certain materials in a force or temperature sensing application, it is necessary to first polarize the material in a desired configuration. In a variety of applications, it is desired to alternate the polarization over the surfaces of the material. Alternating the polarity of piezoelectric and/or pyroelectric activity at different regions of the sensor surface is highly desirable since this enables, among others, the minimization of induced noise from large area environmental disturbances such as sunlight and wind. Surface acoustic wave (SAW) devices involve longitudinal poling where the direction of polarization is parallel to the surface of the body. While numerous techniques for providing alternating poled regions are known, in general such methods and apparatus involve use electroded films. If polarization through the thickness of the body is to be produced, it generally involves use of an electroded body involving an extra step in which electrodes are deposited on the body surface prior to the polarization process. It is therefore desirable to provide a method and apparatus for providing alternating polarization through the thickness of the body and preferably one that does not require pre-electroded materials.

SUMMARY OF THE INVENTION

In accordance with one aspect of the invention therefore, a method of poling a ferroelectric planar body simultaneously in opposite directions transversely through the thickness dimension of the body in a predetermined pattern comprises the steps of sandwiching a polymeric ferroelectric planar body between and in electrical contact with a pair of ground plane plates, said plates having opposite adjacent conjugate patterns of open aperture areas therein and applying an electric field of the same polarity to both sides of the body through the plate apertures thereby to cause alternating polarization in opposite directions through the thickness dimension of the film in adjacent areas corresponding to the conjugate patterns of open aperture areas in the ground plates.

In accordance with another aspect of the invention, apparatus for poling a polymeric ferroelectric planar body in opposite directions transversely through the thickness dimension of the body in a predetermined pattern comprises a pair of ground plane plates adapted for positioning on opposite sides of the planar body in electrical contact with the body, said plates having opposite adjacent conjugate patterns of open aperture areas therein. The apparatus includes first and second corona wire arrays spaced from the pair of ground plates on opposite sides thereof, the arrays having at least one mutual pair of opposed wires aligned with a conjugate pattern of open aperture areas in the ground plane plates.

The apparatus of the invention further includes means for applying a high voltage of the same polarity to the wires aligned with the conjugate pattern of open aperture areas on opposite sides of the planar body whereby a pattern of alternating polarization in opposite directions through the thickness dimension of the film can be created in adjacent areas of the film corresponding to the conjugate pattern of open aperture areas in the ground plates.

DETAILED DESCRIPTION

Figure 1:
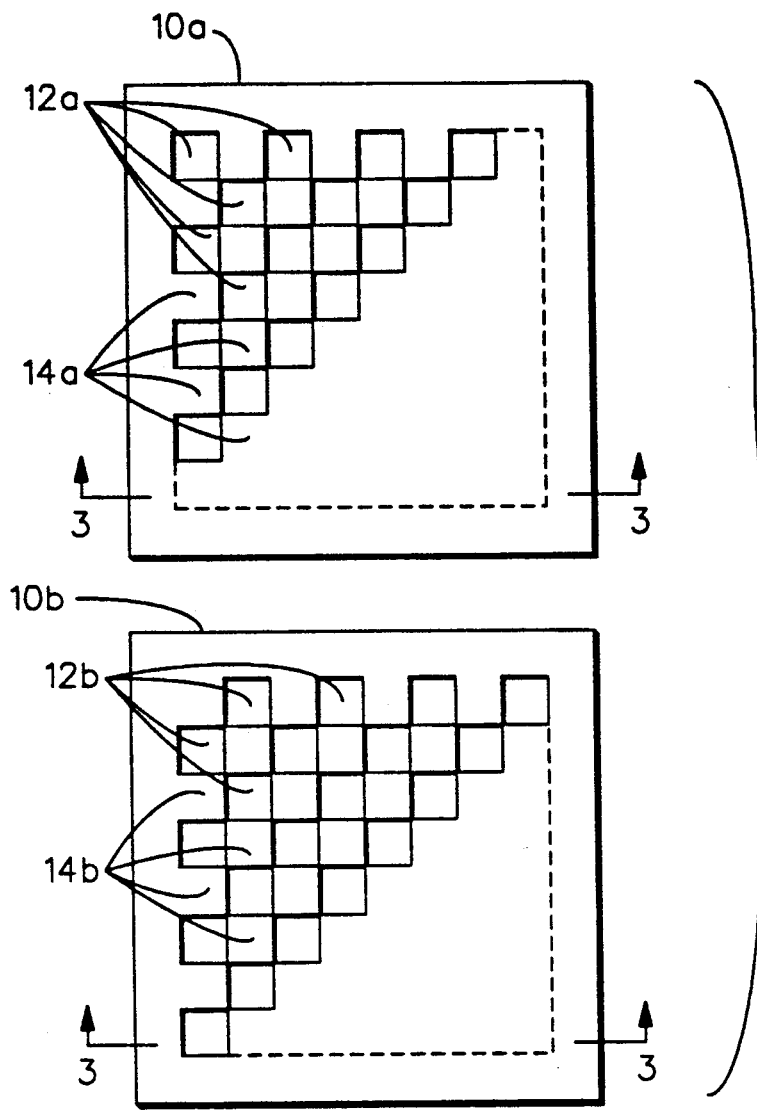
FIGS. 1 shows a pair of ground plates having conjugate patterns of aperture area useful in the present invention.

Referring to FIG. 1 a pair of ground plates 10a, 10b are each provided with a pattern of open aperture areas 12a, 12b which will define the polarized regions of a planar body. Each plate is comprised of an electrically conductive material preferably of a rigid or semi-rigid metal such as stainless steel, aluminum brass or copper. In this illustrative example, the patterns in the metal plates comprise a checkerboard pattern of open aperture areas 12a in plate 10a and aperture areas 12b in plate 10b, with the open aperture areas separated by complementary checkerboard patterns of metal plate areas 14a and 14b, respectively. Although, a checkerboard pattern is illustrated, it will be appreciated that other patterns may be employed as desired, for example, open areas in diamond, hexagonal, round or oval shapes. As can be seen in the illustration, the patterns 12a and 12b are negative or conjugate patterns relative to each other such that when the plates are superimposed over each other, the open areas 12a in plate 10a align with metal areas 14b in plate 10b and, conversely, open areas 12b in plate 10b align with metal areas 14a in plate 10a.

Figure 2:
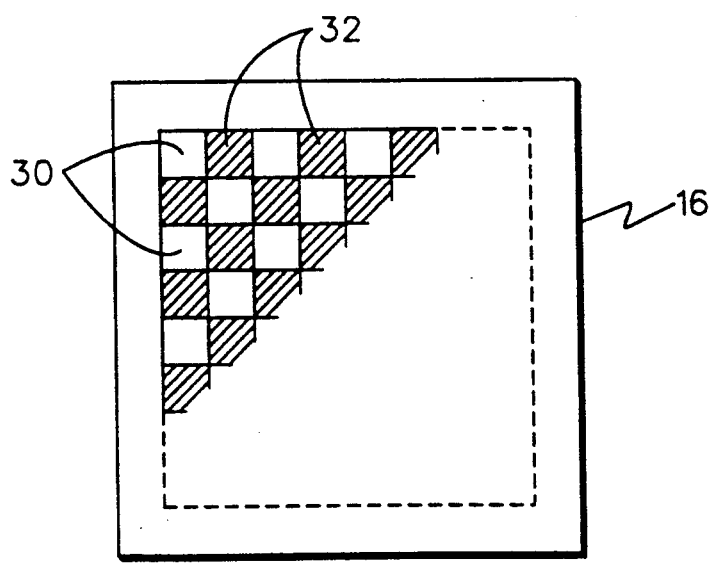
FIG. 2 is a plan view of a polarized planar body having a polarization pattern produced in accordance with the present invention.
Figure 3:
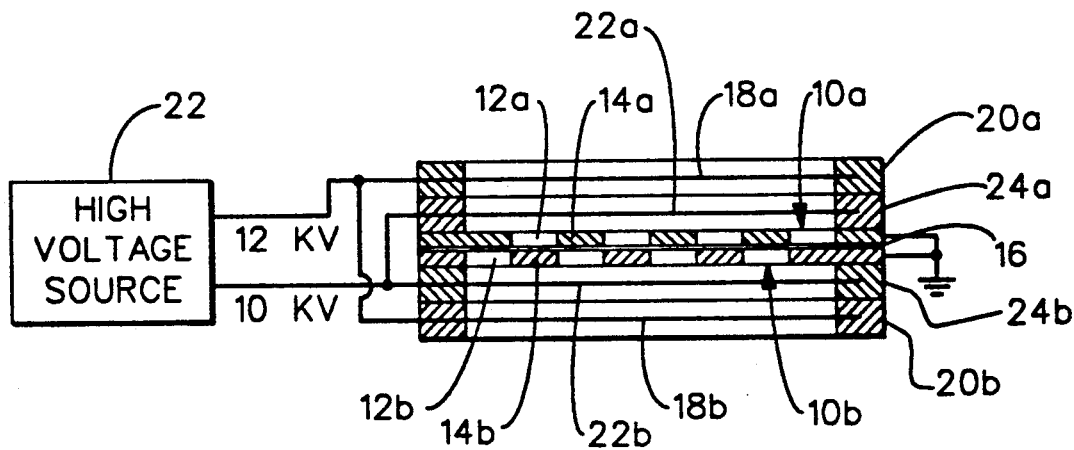
FIG. 3 is a partly schematic diagram in cross section of apparatus useful in practicing the method of the invention.

Referring to FIG. 3, a planar body is polarized in accordance with a feature of the invention to produce a polarization pattern corresponding to the conjugate patterns in metal plates 10a and 10b by sandwiching a planar body 16 of suitable polarizable material between and in electrical contact with plates 10a and 10b. Preferably, the surfaces of the metal plates in contact with body 16 are finished with known polishing techniques to provide good electrical contact between the metal plates and the planar body. The metal plates are grounded to hold the areas of the planar body in contact with the metal plates at ground potential. Corona wires 18a, 18b are provided on opposite sides of the metal plate/planar body sandwich with the wires extending across and in alignment with multiple open aperture areas 12a, 12b. While at least one pair of corona wires are required to achieve alternate polarized areas in the planar body, preferably an array of parallel wires are provided on both sides of the plate/body sandwich to produce a two dimensional array of polarized areas in the planar body as shown in FIG. 2. The wires are suspended by means of frames 20a and 20b and are connected to a common source of high voltage 22 thus providing a high voltage of the same polarity to the corona wires on both sides of the plate/body sandwich. An intermediate control voltage is provided between the corona wires 18a, 18b and the metal plates by means of matching arrays of control wire grids 24a and 24b which are suspended in frames 26a, 26b respectively. Control wires 24a, 24b are aligned with corona wires 18a, 18b, respectively. Suitable clamping means, not shown, are used to hold the assembly of metal plates 10a,10b and wire suspension frames 20a, 20b and 24a, 24b tightly together.

Figure 4:
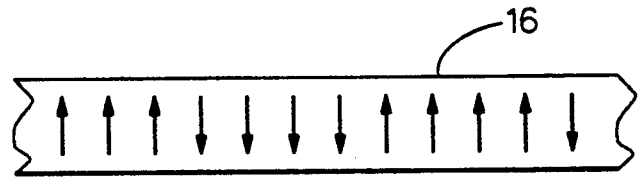
FIG. 4 is a diagrammatic cross section view of a polarized planar body useful in describing the present invention.

In actual embodiments of the invention, a polymeric film of polyvinylideneflouride (PVDF) material with a thickness of 25 μm was employed as the planar ferroelectric body for polarization. In the apparatus employed to perform the polarization, control wires 22a, 22b were suspended ¼" to ½" away from the plates 10a, 10b, respectively and the corona wires 18a, 18b were suspended about ¼" to ½" away from the corresponding control 22a, 22b. A corona potential of 12 Kv was applied to the corona wires 18a, 18b and a control voltage of 10 Kv was applied to the control wires 22a, 22b and the voltages were applied for a period of five minutes at an ambient temperature of —°C. A resultant checkerboard polarization pattern of alternately polarized regions was produced as shown in FIG. 2 in which the unshaded regions 30 represent upward polarized regions and the shaded regions 32 represent downward polarized regions as viewed in the drawing. The corresponding illustration of the polarized regions is shown in the cross section view of the film body 16 shown in FIG. 4.

Biaxially oriented PVDF films are convenient to use for numerous applications utilizing alternate region polarization through body thickness as described above. This is in part because it is a polymer, is pliable, can be rolled up into sheets and cut up into any size or shape without destroying its intrinsic piezoelectric/pyroelectric sensing properties. While other materials may have a higher pyroelectric constant when polarized, PVDF has certain desirable characteristics which give it a relatively high pyroelectric figure of merit. These characteristics include high volume resistivity, low dielectric constant and loss, low specific heat, low density and a broad usable temperature range. Other materials which may be used are copolymers of PVDF and trifouoroethylene (TFE), odd nylons, ceramics such as lead zirconate titanate (PZT), barium titanate, lithium niobate and quartz.

An important aspect of the described polarization procedure is believed to be the ability to simultaneously polarize regions of alternate polarity in the thickness direction in unelectroded films with a single polarity power supply during a single processing operation. Moreover, during the polarization process, the fringing field is minimized. In regard to the resulting poled film, it is important to note that the film includes poled regions of alternate polarity in the thickness direction with sharp boundaries between poled regions.

The method and apparatus described above can be used in a step and repeat process for poling large areas or continuous sheets of polarizable film.

Figure 5:
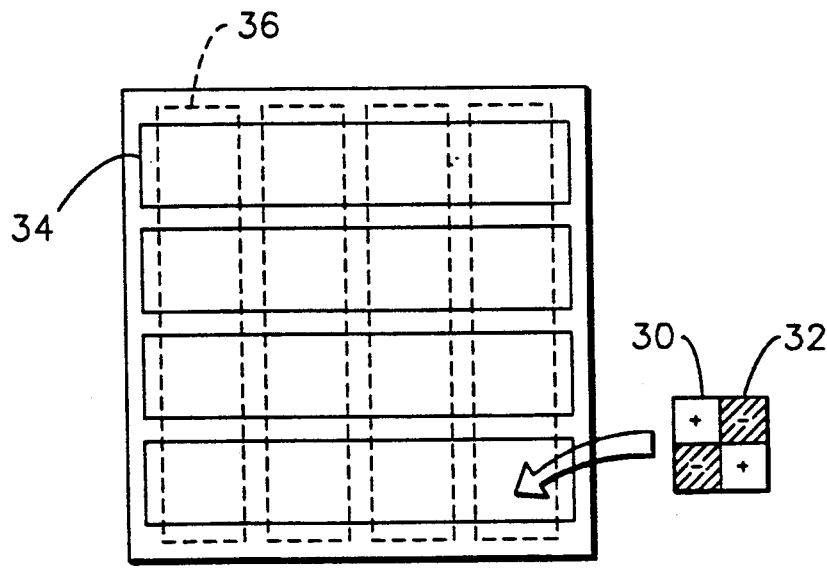
FIG. 5 is a plan view of a polarized planar body with attached electrodes used in describing utility applications of a body produced according to the present invention.

Polarized bodies produced in accordance with the aforedescribed method and apparatus have advantageous utility as position or area sensors. Referring to FIG. 5, there is shown a sample of material 16, which may comprise a PVDF film, which has been polarized in the manner described above and on which orthogonal arrays of electrodes 34 and 36 have been applied to opposite sides of the polarized material. While, at a minimum, the electrodes should intersect so as to include a pattern of at least two alternately poled regions in a one-by-two matrix, in the embodiment shown in FIG. 5, the opposed orthogonal electrodes intersect in a pattern of four alternately poled adjacent regions 30 and 32 (two pairs of each polarity) such that the net charge in the area of intersection is zero. In this illustrated embodiment, the cross shaded areas 32 are poled with opposite polarity relative to the unshaded areas 30. It will be assumed that the bottom side of the film is kept at ground potential.

If a heat or pressure disturbance is incident on the film 16 from above, a positive charge will develop on the top surface of the film at the shaded regions 32 and a negative charge will develop at the unshaded regions 30 wherever the disturbance is experienced. Placing a single electrode over a multiplicity of shaded regions along the film surface spreads the total charge out over the entire electroded surface. On average, there will be as much positive charge as negative charge on the surface so that the net induced charge will be approximately zero. However, considering the electroded sensor utilized as an example of size discrimination, net potential differences will occur only in those areas where the pressure disturbance is not uniform over the top and bottom electroded regions. This implies that potential differences will develop only at the array elements containing the edges of the object. Suitable conventional row and column scanning circuits coupled to the electrodes 34, 36 can then be employed to determine the object size.

It will be appreciated that what has been described is a novel and effective method and apparatus for producing unelectroded planar bodies with alternately poled adjacent regions through the thickness dimension of the body, which bodies are then useful as sensor surfaces for pressure or temperature disturbances. While the invention has been described in detail with particular reference to a presently preferred embodiments, it will be understood that variations and modifications can be effected within the spirit and scope of the invention.

I claim:

1. A method of poling a ferroelectric planar body in opposite directions through the thickness dimension of the body with regions of alternate polarity at different lateral locations across the surface of the body in a predetermined pattern comprising the steps of:
   sandwiching a ferroelectric planar body between and in electrical contact with a pair of ground plane plates, said plates having opposite adjacent conjugate patterns of open aperture and ground plane plate areas therein;
   positioning said sandwiched body and plate between spaced apart parallel arrays of electrodes, said electrodes being spaced from said plates and being aligned with said aperture patterns;
   and applying a voltage of the same polarity to said electrodes for generating an electric field of the same polarity to both sides of the body through said plate apertures, thereby to cause alternating polarization in opposite directions through the thickness dimension of the body in adjacent areas corresponding to said conjugate patterns of open aperture and ground plane plate areas in the ground plane plates.

2. The method of claim 1 in which said electric field is applied simultaneously to both sides of the body.

3. Apparatus for poling a ferroelectric planar body in opposite directions through the thickness dimension of the body with regions of alternate polarity at different lateral locations across the surface of the body in a predetermined pattern comprising:
   a pair of ground plane plates positioned on opposite sides of said body in electrical contact with said body, said plates having opposite adjacent conjugate patterns of open aperture and ground plane plate areas therein;
   first and second corona wire arrays spaced from said pair of ground plates on opposite sides thereof, said arrays having at least one mutual pair of opposed wires aligned with a conjugate pattern of open aperture said ground plane plate areas in the ground plane plates;
   and means for applying a high voltage of the same polarity to said wires aligned with said conjugate patterns of open aperture areas whereby a pattern of alternating polarization in opposite directions through the thickness dimension of film can be created in adjacent areas of the film corresponding to said conjugate patterns of open aperture and ground plane plate areas in the ground plates.

4. Apparatus according to claim 3 including a pair of wire grids, each grid being positioned between a corona wire array and its corresponding ground plate with the grid wires aligned with the open aperture areas in its respective ground plate and means for applying a control voltage to the wire grids to control the electric field applied to the aperture areas by the corona wire arrays.

* * * * *